US009826633B2

(12) United States Patent
Cherenack et al.

(10) Patent No.: US 9,826,633 B2
(45) Date of Patent: Nov. 21, 2017

(54) ELECTRICALLY CONDUCTING TEXTILE DEVICE

(71) Applicant: PHILIPS LIGHTING HOLDING B.V., Eindhoven (NL)

(72) Inventors: Kunigunde Hadelinde Cherenack, Eindhoven (NL); Jacobus Petrus Johannes Van Os, Eindhoven (NL); Roland Marinus Schuurbiers, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 21 days.

(21) Appl. No.: 15/032,044

(22) PCT Filed: Nov. 5, 2014

(86) PCT No.: PCT/EP2014/073752
§ 371 (c)(1),
(2) Date: Apr. 25, 2016

(87) PCT Pub. No.: WO2015/067626
PCT Pub. Date: May 14, 2015

(65) Prior Publication Data
US 2016/0270223 A1 Sep. 15, 2016

(30) Foreign Application Priority Data

Nov. 5, 2013 (EP) .................................... 13191533

(51) Int. Cl.
*H05K 1/09* (2006.01)
*H05K 1/03* (2006.01)
(Continued)

(52) U.S. Cl.
CPC ............. *H05K 1/038* (2013.01); *H05K 1/028* (2013.01); *H05K 1/0283* (2013.01);
(Continued)

(58) Field of Classification Search
CPC ...... H05K 1/038; H05K 1/0283; H05K 1/189; H05K 3/321; H05K 2201/0281; H05K 1/028; H05K 1/0296; H05K 1/181; H05K 2201/10113; H05K 2201/10151
USPC ......................................................... 174/257
See application file for complete search history.

(56) References Cited

U.S. PATENT DOCUMENTS

2008/0196783 A1 8/2008 Van Bruggen et al.
2010/0149767 A1 6/2010 Biesheuvel et al.
(Continued)

FOREIGN PATENT DOCUMENTS

DE 202006015357 U1 2/2007
EP 1469707 A2 10/2004
(Continued)

*Primary Examiner* — Sherman Ng

(57) ABSTRACT

A device comprising a first and a second electrically conductive textile portion is provided, wherein the first and second textile portions are electrically isolated from each other. The device also comprises an electrical element having a first contact pad which is electrically connected to the first textile portion and a second contact pad which is electrically connected to the second textile portion, wherein the first and second textile portions are adapted to supply the electrical element with electrical power. An improved textile device is thereby provided, which is capable of supplying an electrical element with electrical power.

13 Claims, 3 Drawing Sheets

(51) Int. Cl.
*H05K 1/02* (2006.01)
*H05K 1/18* (2006.01)
*H05K 3/32* (2006.01)

(52) U.S. Cl.
CPC .......... *H05K 1/0296* (2013.01); *H05K 1/181* (2013.01); *H05K 1/189* (2013.01); *H05K 3/321* (2013.01); H05K 2201/0281 (2013.01); H05K 2201/10113 (2013.01); H05K 2201/10151 (2013.01)

(56) References Cited

U.S. PATENT DOCUMENTS

| | | | |
|---|---|---|---|
| 2012/0032224 A1 | 2/2012 | Fang et al. | |
| 2012/0327651 A1* | 12/2012 | Cornelssen | F21S 8/033 362/231 |
| 2012/0327654 A1* | 12/2012 | Bhattacharya | G09F 9/33 362/235 |
| 2013/0176737 A1* | 7/2013 | Zhou | H05K 1/038 362/249.06 |

FOREIGN PATENT DOCUMENTS

| | | | | |
|---|---|---|---|---|
| GB | 2396252 A * | 6/2004 | ............... | G09F 9/33 |
| WO | 2008120138 A1 | 10/2008 | | |
| WO | 2009053872 A1 | 4/2009 | | |
| WO | 2011036617 A1 | 3/2011 | | |
| WO | 2012038849 A1 | 3/2012 | | |
| WO | 2013084108 A1 | 6/2013 | | |

* cited by examiner

ELECTRICALLY CONDUCTING TEXTILE DEVICE

CROSS-REFERENCE TO PRIOR APPLICATIONS

This application is the U.S. National Phase application under 35 U.S.C. §371 of International Application No. PCT/EP2014/073752, filed on Nov. 5, 2014, which claims the benefit of European Patent Application No. 13191533.2, filed on Nov. 5, 2013. These applications are hereby incorporated by reference herein.

FIELD OF THE INVENTION

The present invention generally relates to the field of devices comprising electrically conductive textiles, and methods for manufacturing the same.

BACKGROUND OF THE INVENTION

Textiles including electrical conductors for driving electronic components such as light emitting diodes (LEDs), providing electrostatic discharge (ESD) prevention, and flexible and foldable displays are known. Such textiles enable the development of for example wearable electronics and products with integrated functionality, such as light emission, sensing, and light therapy.

In for example US-2008/0196783, a textile is disclosed which is formed from interwoven electrically conductive and non-conductive yarns to provide an array of connection points on the surface of the textile, to which surface LEDs can be attached. Both the warp and the weft comprise electrically conductive and non-conductive yarns, wherein loops are formed by the electrically conductive weft yarns to provide electrical connection points together with proximal portions of the electrically conductive warp yarns.

Although different textile devices are known, there is a need for new devices and methods for supplying electrical elements with electrical power.

SUMMARY OF THE INVENTION

It would be advantageous to achieve an improved textile device. In particular, it would be desirable to enable a device comprising a textile capable of supplying an electrical element with electrical power.

This is achieved by a device and a method having the features defined in the independent claims. Embodiments are defined in the dependent claims.

Hence, according to a first aspect of the invention a device comprising a first and a second electrically conductive textile portion is provided, wherein the first and second textile portions are electrically isolated from each other. The device also comprises an electrical element having a first contact pad which is electrically connected to the first textile portion and a second contact pad which is electrically connected to the second textile portion. The first and second textile portions are adapted to supply the electrical element with electrical power.

According to a second aspect of the invention, a method for manufacturing a device according to the first aspect is provided. The method comprises providing a first electrically conductive textile portion and providing a second electrically conductive textile portion being electrically isolated from the first textile portion. Further, the method comprises the step of providing an electrical element having a first contact pad and a second contact pad, electrically connecting the first contact pad to the first textile portion, and electrically connecting the second contact pad to the second textile portion.

In the context of the present invention, the term "electrically conductive textile portion" should be interpreted to refer to a portion of a textile, geometrically defined in at least two dimensions, which as a whole is arranged to be used as a single electrode capable of conducting electricity.

The invention makes use of an understanding that the textile portions can be used to enable supply of electrical power to the electrical element without using a linear grid of conductive warp and weft yarns being integrated in a non-conducting textile. Making use of electrically conducting textile portions rather than textiles having interwoven conductive yarns is advantageous in that the risk for electrical interruptions due to damages, such as tearing and unraveling, may be reduced. If a part of the textile portion starts tearing or unraveling, the electrical element may still be supplied with electrical power due to the electrical conductivity of the textile portion. The use of conductive textile portions results in a device having improved electrical reliability and redundancy as compared with prior art textile devices having interwoven conductive yarns.

The electrically conductive textile portions allow the current, and thus the generated heat, to be distributed over the textile portions and thereby reduce the risk for local heating and hotspots. This also allows for higher currents to be used with the device.

Using textile portions to distribute the electrical power to the electrical elements may advantageously allow for a device having improved textile properties, i.e. being possible to for example bend and fold, and having improved softness, fuzziness, and drapability.

The present invention is also advantageous in that it may facilitate the positioning of the electrical element. Using electrically conductive textile portions, the possible locations of the electrical element may not be restricted to the path of a conductive yarn. This may also apply for the connection of an external power supply, which positive and negative poles may be connected to connection points that are not limited to a specific conductive yarn or a single connection point of the first and the second textile portions, respectively. The external power supply may be connected to the textile portions at almost any connection point of the textile portions, as long as the positive and negative poles are connected to different textile portions.

In the present specification, the term "textile" may include a material of interlacing fibers, such as a fabric, a tissue or cloth made by for example weaving, knitting, felting, printing, or pressing. Further, the term "electrical element" may include sensors, actuators, driver integrated circuits, batteries, light emitting elements such as LEDs, and the like.

According to an embodiment, the first and second textile portions may each include a surface portion which is electrically conductive. In other words, the first textile portion and the second textile portion may each be arranged to conduct an electrical current in at least their respective surfaces, which surface may be geometrically defined in two dimensions. The contact pads of the electrical element may then be electrically connected to the textile portions by for example directly attaching the contact pads to the electrically conductive surface portions.

According to an embodiment, the first and second textile portions may each include interlaced fibers. The fibers may for example include yarns or threads that are knitted or woven together so as to form a textile. The interlaced fibers enable the textile portions to be stretchable and/or elastic, which can be used in for example garments and wearable textile devices of improved comfort. Stretchable and/or elastic textile portions allow for devices whose area, or size can be adjusted.

The interlaced fibers are also advantageous in that they may provide textile portions being able to absorb and distribute mechanical forces, and hence reduce the risk of damages caused by tearing and unraveling, and damages that may occur for example during washing. Thereby a more reliable and hardwearing device is provided, having an improved flexibility, stretchability and washability.

According to an embodiment, the fibers may be formed of (or may include) an electrically conductive material, such as a metal including silver, stainless steel, copper and nickel, or an electrically conductive polymer or carbon. Traditional textile manufacturing methods such as weaving, knitting or felting may be then employed to achieve an electrically conductive textile. In such textiles, the fibers are interlaced and may be electrically connected to each other at several points, which advantageously increases the redundancy of the electrical conductivity. In other words, by interlacing electrically conductive fibers, the textile portions may continue to conduct electricity even if one or several of the fibers are broken or damaged. Such textile portions also allow for the electrical element to be supplied with electrical power regardless of the location at which the contact pads are attached to the textile portions.

According to an embodiment, at least one of the first and second textile portions may be at least partially coated with an electrically conductive material. In other words, a non-conductive textile portion may be provided and coated with the electrically conductive material so as to achieve an electrically conductive textile portion. The textile portion may for example be formed of a non-conductive fiber being coated with the electrically conductive material. The fiber may for example be coated prior to or after forming the textile portion. The coating may for example comprise an electroplated conductive material.

According to an embodiment, the first and second contact pads may be electrically connected to a plurality of fibers of the first and second textile portions, respectively, which is advantageous in that it improves the reliability of the device in terms of electrical conductivity provided by the textile.

According to an embodiment, the first and second textile portions extend in a common plane. In other words, the electrical element may be arranged in between the textile portions and hence mechanically connect the rims of the textile portions.

According to other embodiments, the first and second textile portions may extend in separate planes. As an example, the textile portions may be stacked with respect to each other and electrically separated by an isolating layer. The isolating layer may for example comprise a non-conductive textile that physically separates the electrically conductive textile portions. Thereby a device comprising an electrically conductive top layer, an isolating intermediate layer, and an electrically conductive bottom layer may be provided. The top and intermediate layers may be provided with a pattern defined by removed material so as to enable the electrical element to be electrically connected to both the top layer and the bottom layer. In such case, the first contact pad may be attached to the top layer, for example at a location close to the rim defining the pattern, and the second contact pad connected may be connected to the bottom layer, for example at a location exposed by the pattern.

The present embodiment is advantageous in that it allows for an increased degree of freedom regarding the positioning of the electrical element, since the possible connection points of the contact pads are not limited to positions close to the rim of the textile portion, but to the rim defining the pattern of the textile portion.

According to an embodiment, the first and second contact pads may be connected to the first and second textile portions, respectively, by means of an electrically conducting adhesive, or glue. The conductive glue may for example be applied to the connection point on the textile portions by dispensing or printing and the electrical element may then be placed by a pick-and-place technology or mounted by hand. The conductive glue is advantageous in that it may sink into the textile and thereby enable an improved mechanical and electrical connection between the electrical element and the textile portion. The conductive glue is also advantageous in that it may be cured at a relatively low temperature compared with other mounting techniques using for example solder. The use of such glue is advantageous in that it allows the use of heat sensitive materials and component to form the device. The joint formed by the conductive glue may also be more elastic as compared with a soldered joint, which may reduce the risk for cracking and loosening joints.

Alternatively, or additionally, the first and second contact pads may be mechanically clamped to the first and second textile portions, respectively, for example by means of staples.

It will also be appreciated that a non-conductive material, such as for example non-conductive glue, may be added to the joint between the first and second contact pads and the first and second textile portions, respectively, in order to relieve the mechanical load on the joints and hence improve the reliability of the mechanical and/or electrical connection. The non-conductive material may be arranged to sink into the textile portion and to partially or fully cover the joints and/or the electrical element.

According to an embodiment, the first and second textile portions may be attached to a non-conductive substrate. The substrate may for example be elastic and/or stretchable, and may have corresponding mechanical properties as the first and second textile portions so as to reduce possible mechanical stresses between the textile portions and the substrate. The substrate may also have mechanical properties that differ from the properties of the first and/or second textile portions. As an example, the substrate may have an expansion coefficient that differs from the expansion coefficient of the first and second textile portions. In such case an elastic or stretchable first and/or second textile portion may advantageously be used.

The first and second textile portions may be attached to the substrate by for example lamination or gluing. As an example, the substrate may comprise a non-conductive textile, and may for example form part of an article of clothing, a piece of furniture, or a wallpaper.

The substrate may advantageously provide a support for the first and second textile portions both during manufacturing and during operation or use of the device. The mounting of the electrical elements may be facilitated since the textile portions may be kept at a fixed position during the mounting, and the risk for shortcuts during use may be reduced by the isolating substrate helping to keep the first and second textile portions apart.

According to an embodiment, the electrical element may be one of a semiconductor device, a light emitting element and a sensor device. The term "light emitting element" may refer to any device or element that is capable of emitting radiation in any region or combination of regions of the electromagnetic spectrum, for example the visible region, the infrared region, and/or the ultraviolet region, when activated for example by applying a potential difference across it or passing a current through it. A light emitting element can therefore have monochromatic, quasi-monochromatic, polychromatic or broadband spectral emission characteristics. Each light emitting element has at least one light source. Examples of light sources include semiconductor, organic, or polymer/polymeric light emitting diodes (LEDs), blue LEDs, optically pumped phosphor coated LEDs, optically pumped nano-crystal LEDs or any other similar devices. Furthermore, the term light-emitting element can be used to define a combination of the specific light source that emits the radiation in combination with a housing or package within which the specific light source or light sources are placed. For example, the term light emitting element may comprise a bare LED die arranged in a housing, which may be referred to as a LED package. Alternatively, or additionally, the light emitting element may comprise a LED that is capable of communicating with an external data source. Thereby the operation, such as the light intensity of the LED, may be controlled. The communication may for example be realized by means of an electrical or wireless data link.

According to an embodiment, the method for manufacturing the device may further comprise attaching the first and second textile portions to a non-conductive substrate which thereby may provide a support for the first and second textile portions both during manufacturing and during use of the device.

According to an embodiment, the manufacturing method comprises connecting a power supply to a connection point of each textile portion so as to supply the electrical element with electrical power, and adjusting the distance between the electrical element and the connection points so as to control the electrical power supplied to the electrical element. By reducing the distance between the connection point of the external power supply and the electrical element, the electrical power supplied to the electrical element may be increased. Consequently, increasing the distance from the connection point of the power supply to the electrical element, the latter may be supplied with less electrical power. Hence, by varying the distance between the connection point and the electrical element, the electrical power that is supplied to the electrical element may be varied without varying the electrical power that is input, or fed to, the device. As an example, in case the electrical element is a LED, the amount, or intensity of emitted light can be varied by varying the position of the connection points of the external power supply. Further, in case of a plurality of LEDs being arranged at different positions of the device, the amount of emitted light may vary between the different LEDs depending on their distance to the connection points, respectively.

It is noted that embodiments of the invention relate to all possible combinations of features recited in the claims. Further, it will be appreciated that the various embodiments described for the device are all combinable with embodiments described for the method as defined in accordance with the second aspect.

BRIEF DESCRIPTION OF THE DRAWINGS

These and other aspects will now be described in more detail with reference to the appended drawings showing embodiments, wherein:

FIG. 3b is a top plan view of the device in FIG. 3a; and

All the figures are schematic, not necessarily to scale, and generally only show parts which are necessary in order to elucidate the embodiments, wherein other parts may be omitted or merely suggested. Like reference numerals refer to like elements throughout the description.

DETAILED DESCRIPTION OF THE EMBODIMENTS

Figure 1:
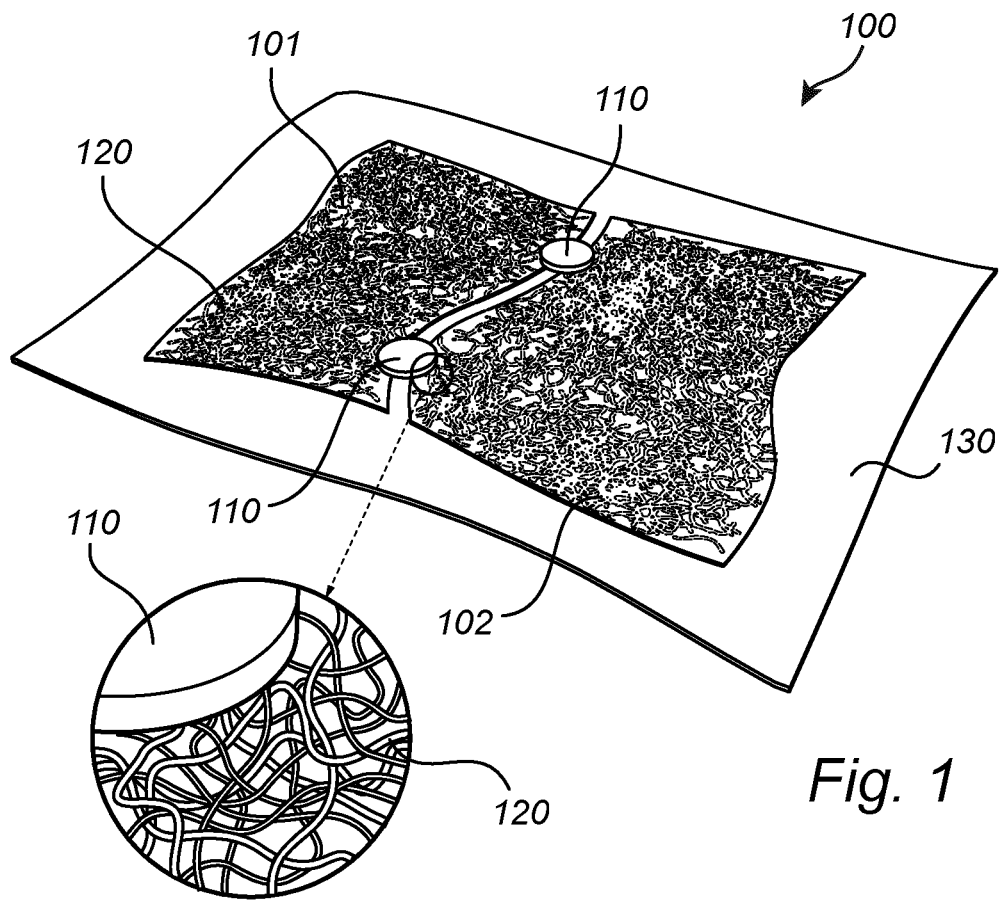
FIG. 1 shows a top plan view of a device comprising first and second electrically conductive textile portions and electrical elements according to an embodiment.

The present aspects will now be described more fully hereinafter with reference to the accompanying drawings, in which currently preferred embodiments are shown. This invention may, however, be embodied in many different forms and should not be construed as limited to the embodiments set forth herein; rather, these embodiments are provided for thoroughness and completeness, and fully convey the scope of the present aspects to the skilled person.

A device according to an embodiment will be described with reference to FIG. 1. The device 100 comprises first and second electrically conductive textile portions 101, 102, which are electrically isolated from each other. The device 100 also comprises two electrical elements 110 (for example LEDs), each comprising first and second contact pads (not shown in FIG. 1) that are electrically connected to the device. The first contact pad may be connected to the first textile portion 101 and the second contact pad to the second textile portion 102 in order to supply the LEDs 110 with electrical power. Further, the electrically conductive textile portions 101, 102 are attached to a non-conductive substrate 130.

The first textile portion 101 and the second textile portion 102 are formed by electrically conductive fibers 120 that are interlaced (for example by felting, knitting or weaving) and thereby electrically connected to each other. The non-conductive substrate 130 may also comprise a textile formed of for example interlaced fibers. However, these fibers, and hence the surface of the substrate 130, may be electrically non-conductive so as to reduce the risk of short-circuiting the textile portions 101, 102 being attached thereon.

In this example, the LEDs may be attached to the first textile portion 101 and second textile portion 102 by means of electrically conductive glue that may be added to the textile portions by a dispenser. The LEDs may be positioned on the textile portions by for example a pick-and-place equipment so as to allow the glue to fix the first contact pad and the second contact pad to the electrically conductive textile fibers 120.

The textile portions 101, 102 and the substrate 130 may be chosen such that they allow the device to be for example folded, bent, or draped. Due to the interlacing fibers, the textile portions 101, 102 may also be stretched so as to enable the shape of the device to be modified.

The first electrically conductive textile portion 101 and the second electrically conductive textile portion 102 may be connected to an external power supply (not shown in FIG. 1). As the first and second textile portions 101, 102 may be connected to a first electrical pole and a second electrical pole of the power supply, respectively, electrical current may flow from the first textile portion 101 to the second textile portion 102 via the LEDs 110 which thereby may be supplied with electrical power. Due to the first and second textile portions 101, 102 comprising electrically conductive and electrically connected interlaced fibers 120, the external power supply may be connected to the textile portions 101, 102 at almost any position. Consequently, the LEDs 130 may be connected to the conductive textile portions 101, 102 at any position allowing the first contact pad to be connected to the first textile portion 101 and the second contact pad to be connected to the second textile portion 102. In other words, the LEDs 130 may be connected to the textile portions 101, 102 at any position allowing the LEDs 130 to straddle between the two textile portions 101, 102 that are electrically isolated from each other.

Figure 2:
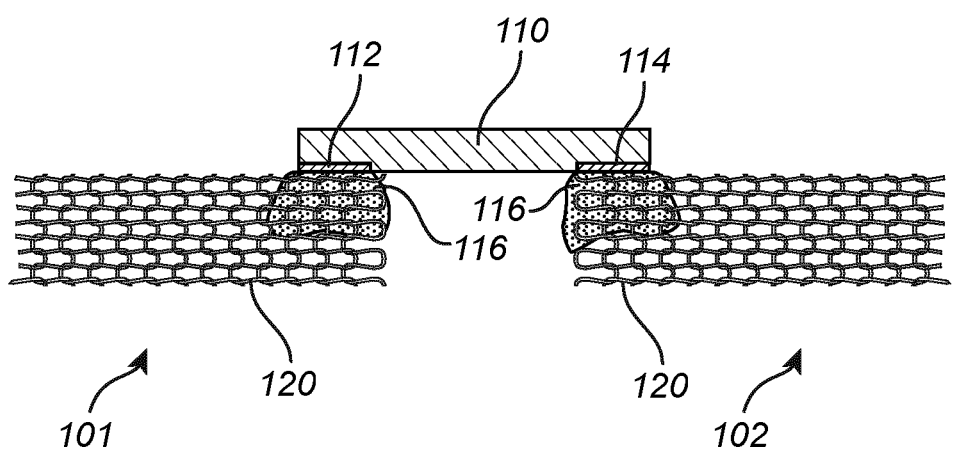
FIG. 2 shows a cross-sectional portion of a device according to an embodiment.

A device 100 according to another embodiment will be described with reference to FIG. 2, which illustrates a cross sectional portion of a device which may be similarly configured as the device described with reference to FIG. 1. The first and second electrically conductive textile portions 101, 102 may be formed of knitted fibers 120 comprising an electrically conductive material (for example nickel). The fibers 120 may however comprise a non-conductive material being coated with an electrically conductive coating (for example electroplated gold). It will be appreciated that the coating may be applied on the fibers 120 before they are formed as a textile, or be applied on the textile once it is formed.

The device 100 may also comprise a LED 110 having a first contact pad 112 and a second contact pad 114 that may be electrically (and mechanically) connected to the first and second textile portions 101, 102, respectively, by means of an electrically conductive adhesive. The adhesive may sink into the textile portions 101, 102 to enable a reliable and strong joint 116. During operation, electrical current may flow between the first and second textile portions 101, 102 via the interlaced fibers 120 and the conductive joints 116, thereby supplying the LED 110 with electrical power.

FIG. 3 is an exploded perspective view of a device according to another embodiment. The device may be similarly configured as the devices previously described with reference to FIGS. 1 and 2.

Figure 3A:
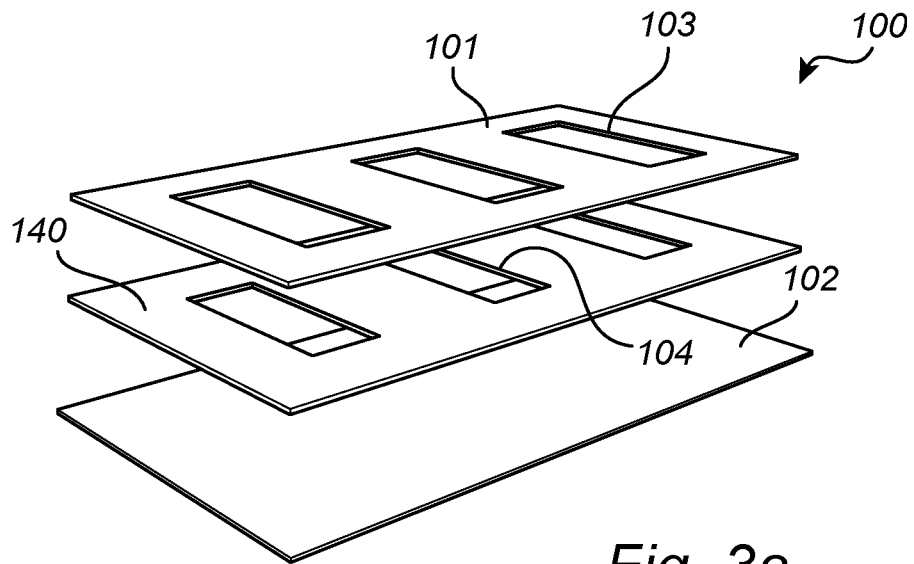
FIG. 3a shows an exploded perspective view of a device according to an embodiment, comprising a first and a second textile portion being stacked.

FIG. 3a shows a device comprising a first electrically conductive textile portion 101 and a second electrically conductive textile portion 102 being electrically separated by an electrically isolating layer 140. It should be noted that the electrical devices are not shown in FIG. 3a. The first and second textile portions 101, 102 and the isolating layer 140 may be stacked, i.e. arranged to overlap each other. The first textile portion 101 may be provided with a pattern wherein portions of the textile are removed (for example by laser cutting). In this example, the pattern 103 of the first textile portion 101 conforms to the shape of three rectangles (or openings) being subsequently arranged in a row. The isolating layer 140 is provided with a corresponding pattern, with the difference that the rectangles (openings) formed in the isolating layer 140 are slightly smaller than the rectangles (openings) of the pattern of the first textile portion 101. As the first textile portion 101 and the isolating layer 140 are arranged, or stacked, on the second textile portion 102 (which may not be provided with such pattern), the pattern may be aligned such that the rectangles (or openings) of the first textile portion 101 are more or less concentric with the rectangles (openings) of the isolating layer 140. An electrical element 110 may then be arranged such that the first contact pad 112 is electrically connected to the first textile portion 101, preferably close to the rim of the structure defining the pattern 103, and the second contact pad is electrically connected to the second textile portion 102. As the (openings) rectangles of the pattern 104 of the isolating layer may be slightly smaller than the corresponding rectangles (openings) of the first textile portion, a portion of the isolating layer may be arranged in between the first and second contact pads 112, 114 of the electrical element 110. The risk for short-circuiting between the first textile portion 101 and the second textile portion 102 may thereby be reduced. It will however be realized that a broad variety of patterns and structure may be used, and that the pattern of the first textile portion 101 may not correspond to or equal the pattern of the isolating layer 140 as long as the electrical element may be arranged such that its first contact pad and its second contact pad may be electrically connected to the first and second textile portions 101, 102, respectively.

Figure 3B:
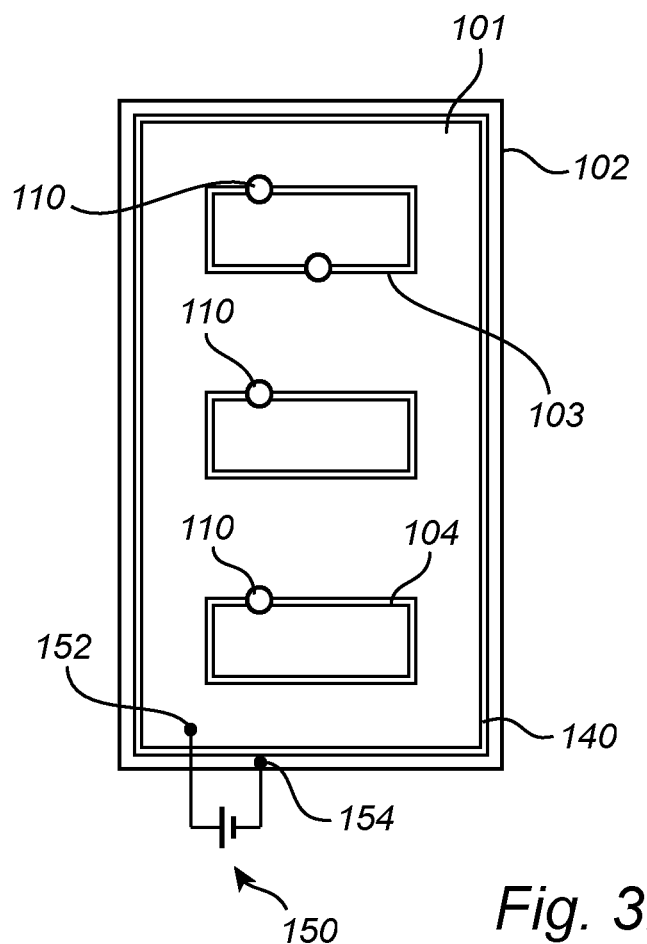

FIG. 3b is a top plan view of the device shown in FIG. 3a, illustrating four LEDs 110 that are electrically connected to the first textile portion and the second textile portion. The rectangular pattern 103 of the first textile portion 101 is slightly different from the pattern 104 of the isolating layer 140 such that the contact pads (not shown in FIG. 3b) of the LEDs may be separated by a portion of the isolating layer 140. Further, an external power supply 150 may be connected to the device such that the first textile portion 101 is electrically connected to a positive pole of the power supply 150 and the second textile portion 102 is electrically connected to a negative pole of the power supply 150 via a connection point 152, 154 of each textile portion 101, 102.

Figure 4:
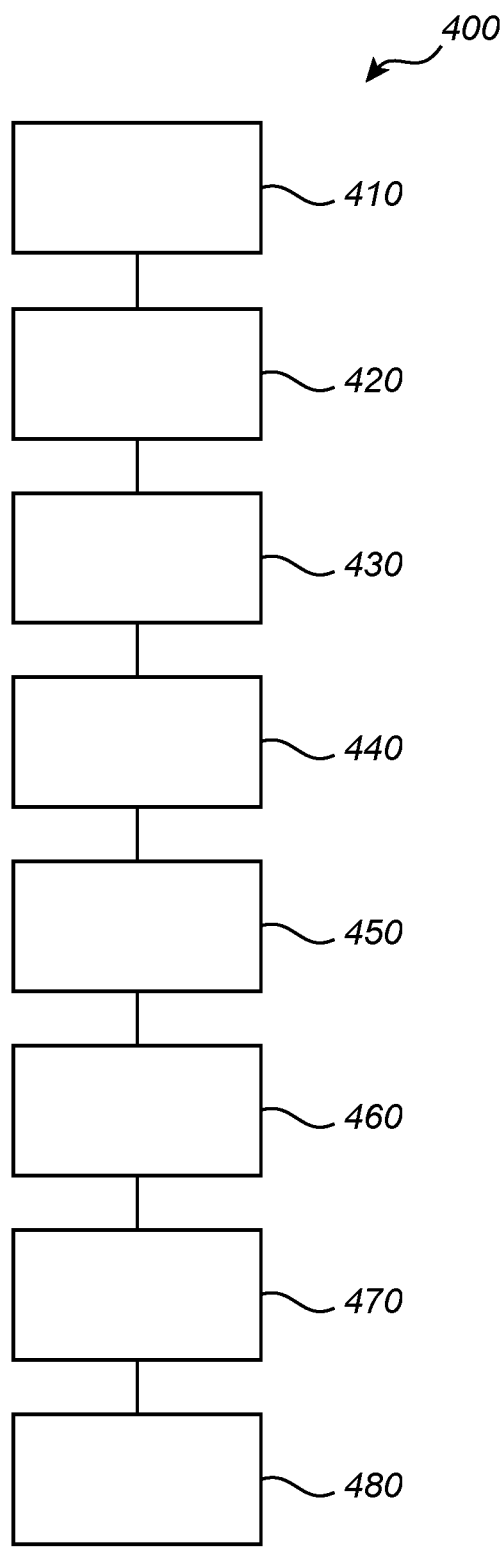
FIG. 4 is an outline of a method according to an embodiment.

A method 400 for manufacturing a device 100 according to an embodiment is outlined in FIG. 4. The device may be similarly configured as the device described with reference to FIGS. 1-3. The method 400 comprises providing 410 the first electrically conductive textile portion 101, providing 420 the second electrically conductive textile portion 102, and attaching 430 the first textile portion 101 and the second textile portion 102 to a non-conductive substrate 130. Further, the electrical element 110 is provided 440, wherein the first contact pad 112 of the electrical element 110 is connected 450 to the first textile portion 101 and the second contact pad 114 is connected 460 to the second textile portion 102. By connecting 470 the power supply to the connection points 152, 154 of each textile portion, the electrical element 110 can be supplied with electrical power. As previously described, the electrical conductivity of the textile portions 101, 102 allows for the electrical power that is supplied to the electrical element 110 to be adjusted by adjusting 480 the distance between the electrical element 110 and the connection point 152, 154.

The device 100 according to the above embodiments may for example form a light emitting device comprising electrically conductive textile portions 101, 102.

The person skilled in the art realizes that the present invention by no means is limited to the preferred embodiments described above. On the contrary, many modifications and variations are possible within the scope of the appended claims. For example, the device may comprise a plurality of electrically textile portions which may comprise a variety of materials, fiber sorts, and be formed by various textile forming techniques.

Additionally, variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A device comprising:
   a first electrically conductive textile portion;
   a second electrically conductive textile portion, the first and second textile portions being electrically isolated from each other; and
   an electrical element having a first contact pad being electrically connected to the first textile portion and a second contact pad being electrically connected to the second textile portion;
   wherein the first and second textile portions are adapted to supply the electrical element with electrical power.

2. The device according to claim 1, wherein the first and second textile portions each includes a surface portion being electrically conductive.

3. The device according to claim 1, wherein the first and second textile portions each includes interlaced fibers.

4. The device according to claim 3, wherein the interlaced fibers comprise an electrically conductive material.

5. The device according to claim 1, wherein at least one of the first and second textile portions is at least partially coated with an electrically conductive material.

6. The device according to claim 1, wherein the first and second contact pads are electrically connected to a plurality of fibers of the first and second textile portions, respectively.

7. The device according to claim 1, wherein the first and second textile portions are stacked with respect to each other and electrically separated by an isolating layer.

8. The device according to claim 1, wherein the first and second textile portions are formed of woven, knitted, crocheted, and/or knotted fibers.

9. The device according to claim 1, wherein the first and second contact pads are connected to the first and second textile portions, respectively, by means of an electrically conducting adhesive.

10. The device according to claim 1, wherein the first and second textile portions are attached to a non-conductive substrate.

11. The device according to claim 1, wherein the electrical element is one of a semiconductor device, a light emitting element and a sensor device.

12. A method for manufacturing a device, comprising the steps of:
   providing a first electrically conductive textile portion;
   providing a second electrically conductive textile portion being electrically isolated from the first textile portion;
   providing an electrical element having a first and a second contact pad;
   electrically connecting the first contact pad to the first textile portion; and
   electrically connecting the second contact pad to the second textile portion.

13. The method according to claim 12, further comprising the steps of:
   connecting a power supply to a connection point of each textile portion so as to supply the electrical element with electrical power, and
   adjusting the distance between the electrical element and the connection points so as to control the electrical power supplied to the electrical element.

* * * * *